United States Patent [19]
Padoan et al.

[11] Patent Number: 5,748,548
[45] Date of Patent: May 5, 1998

[54] DEVICE FOR DETECTING A REDUCTION IN A SUPPLY VOLTAGE

[75] Inventors: Silvia Padoan, Forli; Marco Olivo, Bergamo; Carla Golla, Milan, all of Italy

[73] Assignee: SGS-Thomson Microelectronics S.r.l., Agrate Brianza, Italy

[21] Appl. No.: 711,132

[22] Filed: Sep. 9, 1996

Related U.S. Application Data

[62] Division of Ser. No. 366,211, Dec. 22, 1994, Pat. No. 5,583,820.

[30] Foreign Application Priority Data

Dec. 29, 1994 [EP] European Pat. Off. ............. 93830537

[51] Int. Cl.[6] ............................................. G11C 11/407
[52] U.S. Cl. .......................... 365/226; 324/765; 324/769; 324/771
[58] Field of Search .................... 365/201, 226, 365/230.01; 324/765, 769, 771; 323/284

[56] References Cited

U.S. PATENT DOCUMENTS

| | | | |
|---|---|---|---|
| 4,365,316 | 12/1982 | Iwahashi et al. | 365/72 |
| 4,560,937 | 12/1985 | Finger | 324/433 |
| 4,794,564 | 12/1988 | Watanabe | 365/184 |
| 4,975,883 | 12/1990 | Baker et al. | 365/226 |
| 5,083,045 | 1/1992 | Yim et al. | 307/350 |
| 5,109,187 | 4/1992 | Guliani | 323/313 |
| 5,199,032 | 3/1993 | Sparks et al. | 371/3 |
| 5,426,616 | 6/1995 | Kajigaya et al. | 365/226 |
| 5,426,626 | 6/1995 | Kajigaya | 365/226 |
| 5,583,820 | 12/1996 | Padoan et al. | 365/226 |

FOREIGN PATENT DOCUMENTS

| | | |
|---|---|---|
| 403288400 | 12/1991 | Japan. |
| 404159769 | 6/1992 | Japan. |

*Primary Examiner*—Viet Q. Nguyen
*Attorney, Agent, or Firm*—David V. Carlson; Seed and Berry LLP

[57] ABSTRACT

A circuit for detecting a reduction below a threshold value in a supply voltage provided to storage devices integrated into a semiconductor. A comparator is coupled between a voltage supply line and a signal ground and has a first or reference input and a second or test-signal input. A generator of a stable voltage reference has an output coupled to the first input and a divider of the supply voltage coupled to the second input of the comparator. A circuit means is arranged to feed the voltage supply line with the higher of the supply voltage and a programming voltage also provided to the storage devices.

9 Claims, 3 Drawing Sheets

DEVICE FOR DETECTING A REDUCTION IN A SUPPLY VOLTAGE

CROSS REFERENCE TO RELATED APPLICATION

This application is a division of U.S. patent application Ser. No. 08/366,211, filed Dec. 29, 1994, now U.S. Pat. No. 5,583,820.

TECHNICAL FIELD OF THE INVENTION

This invention relates to a circuit for detecting a voltage threshold even under low supply voltage conditions.

In particular, the invention relates to a circuit for detecting a threshold voltage in storage devices integrated into a semiconductor and for which a power supply above a certain value is provided, the circuit being of the type that comprises a comparator connected between a voltage supply line and a signal ground, and having a first or reference input and a second or signal input, as well as an output terminal.

The invention specifically concerns, but is not limited thereto, a circuit incorporated to a memory coupled to a supply voltage Vdd and a programming voltage Vpp that is integrated into a semiconductor, and reference will be made throughout the ensuing description to such an application for convenience of illustration.

BACKGROUND OF THE INVENTION

As is known, a good many electronic circuit designs involve the provision of a voltage threshold detector, for instance to detect such drops in the supply voltage as may imply malfunction of the circuit.

Consider in particular nonvolatile storage circuits integrated into a semiconductor, wherewith a drop in the supply voltage while the programming voltage is present may impair the memory erasing and programming steps.

A known type of detector circuit is disclosed in U.S. Pat. No. 4,975,883, for example.

Further, the reference voltages against which the comparison is performed, are obtained, for example, from resistive dividers of a supply voltage. Such reference voltages are not, therefore, constant as temperature, and even the supply voltage, vary.

The technical problem underlying this invention is to provide a circuit solution that allows a peculiarly low threshold voltage to be detected, and accordingly, the drawbacks with which the prior approaches are beset to be overcome.

SUMMARY OF THE INVENTION

The solutive idea on which this invention stands is one of carrying out a comparison between a partition of the supply voltage Vdd to be controlled and a stable reference voltage obtained as the difference between the threshold voltages $V_T$ of two natural MOS transistors. In particular, a detector circuit according to one aspect of the present invention generates a reduction-detect signal when the partitioned supply voltage falls below the stable reference voltage while the programming voltage is present.

Based on this solutive idea, the technical problem is solved by a circuit as defined in the characterizing parts of the appended claims.

BRIEF DESCRIPTION OF THE DRAWINGS

The features and advantages of a circuit according to the invention will be apparent from the following detailed description of an embodiment thereof, to be taken by way of example and not of limitation with reference to the accompanying drawings.

DETAILED DESCRIPTION OF THE DRAWINGS

Figure 1:
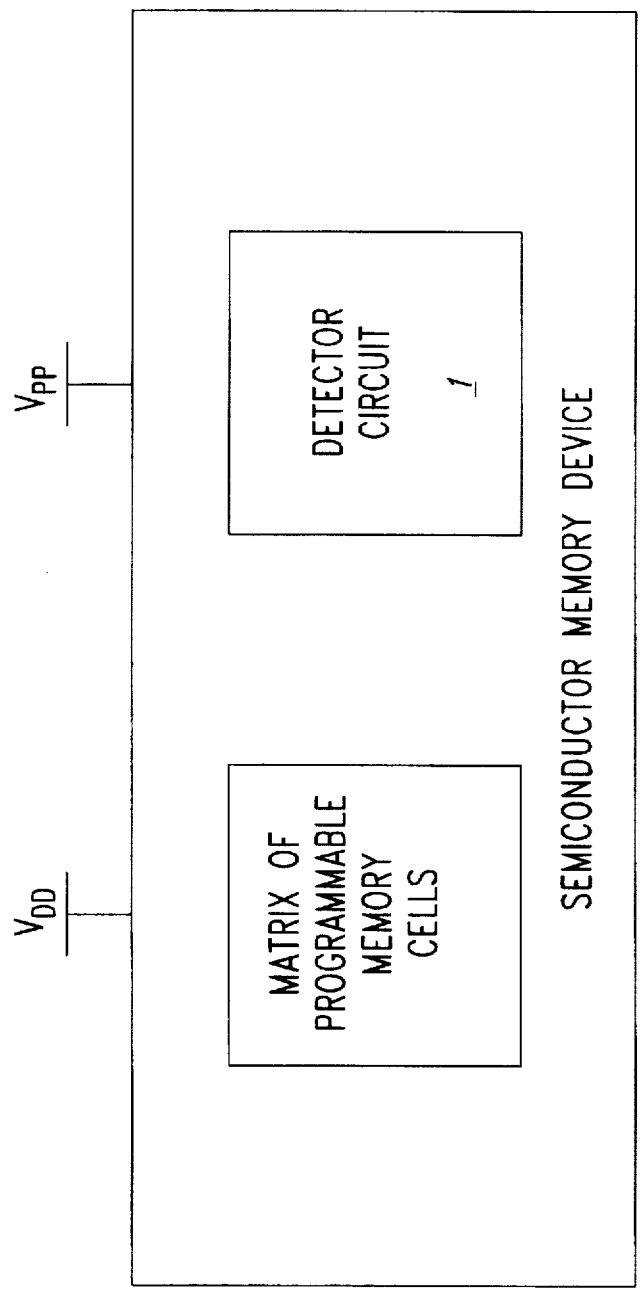
FIG. 1 is a semiconductor memory device according to the present invention.
Figure 2:
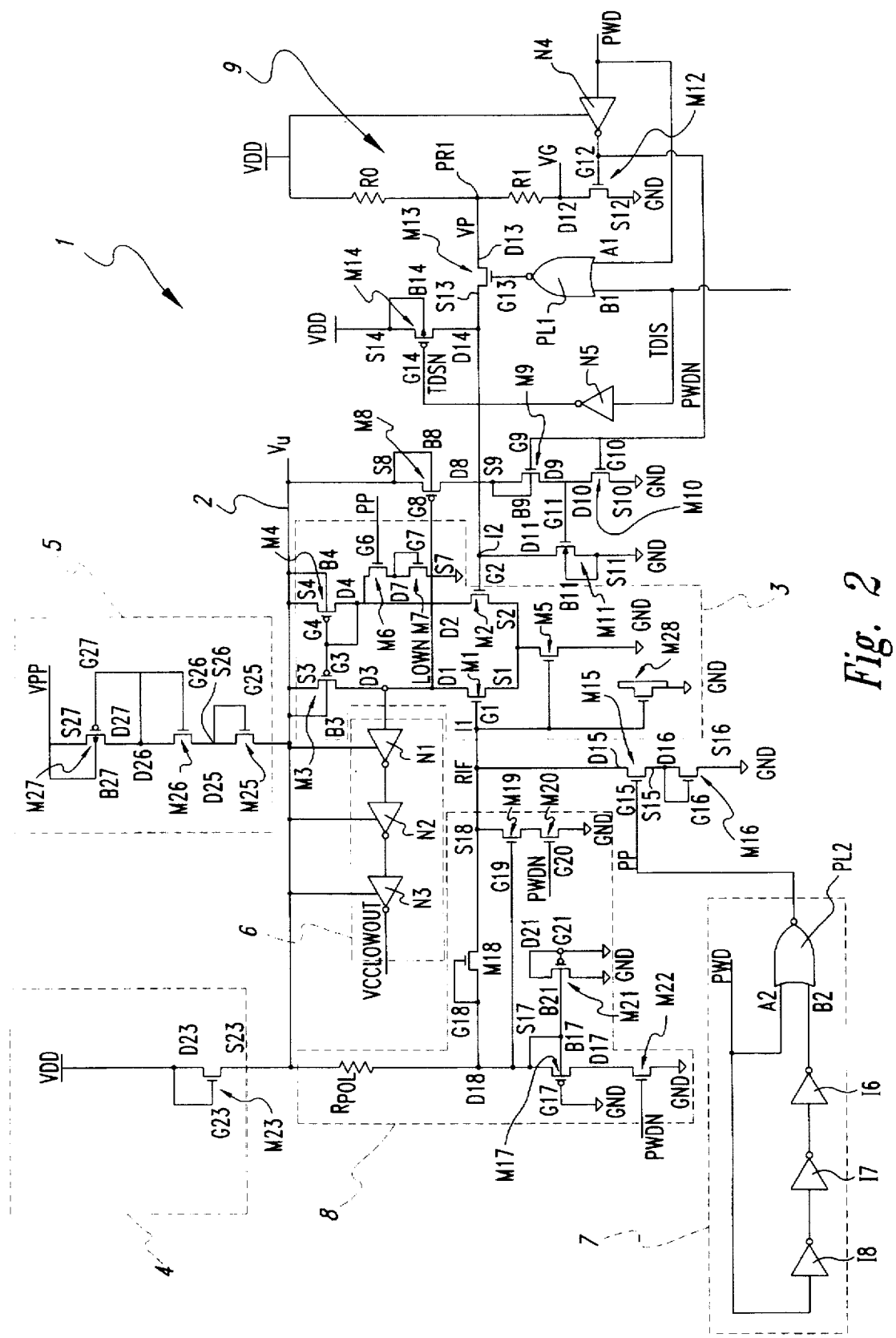
FIG. 2 shows a circuit diagram of the detector circuit of FIG. 1 according to the invention.

FIG. 1 shows a block diagram of a semiconductor memory device, which is coupled to a supply voltage Vdd and a programming voltage Vpp. The device includes a matrix of programmable memory cells and a detector circuit 1 formed according to one aspect of the invention for detecting when Vdd drops below as predetermined voltage threshold. Alternatively, the memory device may generate Vpp from VDD, thus eliminating the need for an external connection to a programming voltage.

With reference to the drawing figures, generally and schematically shown at 1 is a threshold detector circuit which embodies this invention.

The circuit 1 is incorporated into a nonvolatile memory structure integrated into a semiconductor and being supplied a supply voltage Vdd and a programming voltage Vpp.

The supply voltage Vdd is approximately 5 V, while the programming voltage Vpp lies in the 12 V range.

The detector 1 comprises a comparator stage 3 including field-effect transistors, namely: two transistors M1 and M2 of the natural n-channel MOS type, and two transistors M3 and M4 of the p-channel MOS type.

The respective control terminals of the transistors M1 and M2 form the inverting and non-inverting inputs of the comparator 3. Specifically, the gate terminal G1 of the first transistor M1 coincides with the inverting input Ii of the comparator 3, and the gate terminal G2 of the second transistor M2 coincides with the non-inverting input I2 of the comparator 3.

The transistors M1 and M2 have respective source terminals S1 and S2 in common and connected to ground through a current generator formed by a natural MOS transistor M5 of the n-channel type.

A transistor M28, in parallel with M5, has its gate terminal connected to the input I1 of the comparator to discharge the voltage value present on said input to ground as the circuit is turned off.

The other, or drain, terminals D1 and D2 of the transistors M1 and M2 are respectively connected to the drain terminals D3 and D4 of the second transistor pair, M3 and M4, with M3 configured as a current mirror and M4 configured as a diode.

The gate terminals G3 and G4 of these transistors, M3 and M4, are connected together, whereas the source terminals S3 and S4 are connected electrically to a power supply line 2.

The drain terminal D4 of transistor M4 is connected to ground by a series of two natural MOS transistors, M6 and M7. The first of these, M6, receives on its gate terminal G6 a signal PP whose origin will be explained hereinafter. The second transistor, M7, is in a diode configuration, with its gate terminal G7 connected to the drain terminal D7 and its source terminal S7 connected to ground at GND.

The output from the comparator 3 is taken at the drain terminal D1 of transistor M1 and sent to a set of cascade connected inverters, N1, N2 and N3, which constitute an array of buffers of increasing size, collectively denoted by 6. In one aspect of the invention, N1 comprises MOS transistors of dimension W=5, N2 comprises MOS transistors having W=9, and N3 comprises MOS transistors having W=45, where W is the channel width. Because the load draws a relatively large current, such a structure often sources such a current better than a single large buffer.

The inverters in this buffer array are powered from the power supply line 2 and exhibit on their output a parasitic capacitance between the terminal OUT of the last inverter N3 and ground, GND. From this terminal OUT of the inverter N3, a logic output signal, i.e., a dropdetect signal, VCCLOW is taken which is indicative of the supply voltage Vdd having dropped below a predetermined threshold value.

The signal taken from the output of the comparator 3 is also transmitted, over a line LOWN, to the gate G8 of a p-channel MOS transistor M8, which has its body B8 and source S8 terminals connected together and to the power supply line 2.

The transistor M8 is connected serially to two more transistors M9 and M10, and in particular, has its drain terminal D8 connected to the body B9 and source S9 terminals of transistor M9. Transistor M9 has its drain terminal D9 connected electrically to the drain terminal D10 of transistor M10 and to the gate terminal G11 of another MOS transistor M11.

The last-mentioned transistor, M11, has its body B11 and source S11 terminals connected together and to ground at GND. The drain terminal D11 of transistor M11 is connected to the input I2 of the comparator to discharge the voltage value present on the input I2 to ground when the output signal VCCLOW is at a low logic level.

The source terminal S10 of transistor M10 is connected to ground, GND, whereas its gate terminal G10 is connected to the gate terminal G9 of transistor M9. These gate terminals receive a signal PWDN which is obtained from an external signal PWD through an inverter N4 which is fed the supply voltage Vdd.

The output PWDN from the inverter N4 is also applied to the gate terminal G12 of a natural field-effect transistor M12 connected between a resistive divider 9 and ground at GDN. The divider 9 comprises first R0 and second R1 resistive elements, which are connected in series between the supply voltage Vdd and the drain terminal D12 of transistor M12.

The point PRI of interconnection of the resistive elements R0 and R1 is connected electrically to the drain terminal D13 of another transistor M13 of the natural MOS type which is controlled on the gate terminal G13 by the output from a logic gate PL1 of the NOR type.

This logic gate PLI has two inputs, A1 and B1, which receive signals PWD and TDIS, respectively.

The second-mentioned signal TDIS is also supplied to the input of an inverter NS which outputs a signal TDISN for application to the gate electrode G14 of a field-effect transistor M14 connected between the power supply Vdd and the input I2 of the comparator. This transistor M14 has its body B14 and source S14 electrodes connected together and to the power supply Vdd.

The drain terminal D14 of transistor M14 is connected to the source S13 of transistor M13 and to the input I2 of the comparator 3 to transfer a test signal designated PART, which is generated at node PRI by voltage divider 9.

The other input I1 of the comparator 3 is taken to ground by a natural MOS transistor M28. The transistor M28 has its source S28 and drain D28 terminals connected together and to ground at GND.

The input I1 of the comparator 3 is also connected to ground by a series of a first natural MOS transistor M15 and a second natural MOS transistor M16 connected in a diode configuration.

The last-mentioned transistor M16 has respective gate G16 and drain D16 terminals shorted and its source terminal S16 grounded to GND.

Connected to the gate terminal GIS of the first transistor M15 is the output of a monostable line, shown at 7 and carrying the signal PP.

This monostable line 7 comprises a series of three inverters, I6, I7 and I8, and a logic gate PL2 of the NOR type having two inputs A2 and B2. One input, A2, receives the signal PWD, also input to the inverter cascade, and the other input, B2, receives the output from the inverter cascade.

Also connected to the input I1 of the comparator 3 is the output of a stable reference voltage generator, denoted by 8.

The generator 8 comprises a resistive element $R_{POL}$ connected to the power supply line 2 and the drain terminal D18 of the natural MOS transistor M18, having its gate electrode G18 shorted to the drain electrode D18. The source electrode S18 is connected to the input I1 of the comparator.

Said source electrode, S18, is also connected to ground by a series of two natural transistors M19 and M20, the former of which has its gate electrode G19 connected to the source electrode S17 of a transistor M17, whilst the latter is controlled on the gate electrode G20 by the signal PWDN.

The natural MOS transistor M17 has its source terminal S17 connected to the drain terminal D18 of transistor M18 and its gate terminal G17 connected to ground, GND. The body terminal B17 of transistor M17 is shorted to the source terminal S17 and the body terminal B21 of another transistor M21, the remaining terminals of M21 being coupled to ground.

The drain terminal D17 of transistor M17 is connected, serially toward ground, to a natural transistor M22 which receives the signal PWDN on its gate terminal G22.

The power supply line 2 is connected to both the pole of the supply voltage Vdd and a pole of the programming voltage Vpp.

The connection of supply line 2 to the supply voltage Vdd is established through a transistor leg, denoted by 4 and including a MOS transistor M23.

This transistor M23 is a natural MOS of the n-channel type and has its source electrode S23 connected to the power supply line 2 and its gate electrode G23 connected to the drain electrode D23 and the supply voltage Vdd.

The power supply line 2 is connected to the programming voltage Vpp via a second leg 5 of transistors comprising a series of three MOS transistors M25, M26 and M27, with the first two being of the n-channel type and the third of the p-channel type.

The transistor M25 has its source electrode S25 connected electrically to the power supply line 2 and its gate G25 and drain D25 terminals connected together and to the drain terminal D2G of the second transistor M26.

This transistor M26 has its gate G26 and drain D26 terminals connected together and to the drain D27 and gate G27 terminals of the third transistor M27. This transistor M27 has its source terminal S27 and body terminal B27 connected to the programming voltage Vpp pole.

The operation of the detector circuit according to the invention will now be described.

The comparator 3 has a stable reference voltage RIF, unrelated to the supply voltage and the temperature, held on its first input II.

This stable voltage reference is obtained by means of the generator circuit 8, which allows the voltage RIF to be obtained as the difference between the respective threshold voltages of the two natural MOS's, M17 and M18, M17 of the natural p-channel type and M18 of the natural n-channel type. Using this stable voltage reference, the tripping threshold of the comparator can be set accurately. In one aspect of the invention, M17 has a threshold of approximately −1.7 V, and M18 has a threshold of approximately +0.6 V, giving a stable reference voltage RIF of approximately 1.1 volts. The generator 8 is described in a pending U.S. Application No. 08/347,788, filed on Nov. 30, 1994, entitled "STABLE REFERENCE VOLTAGE GENERATOR CIRCUIT."

The second input I2 of the comparator 3 is input a voltage signal PART taken from the resistive partition 9 of the supply voltage Vdd. The voltage signal PART varies linearly with the supply Vdd.

The voltage value on the comparator power supply line is dependent upon the higher voltage between the power supply Vdd pole and the second programming Vpp pole. In fact, the line 2 is connected to the power supply pole through the transistor leg 4 and to the programming pole through the second transistor leg 5.

In particular, the voltage on the line 2, designated Vu, for example, will take the largest of the following values:

the value of Vpp minus the threshold voltage of the three transistors, M25, M26 and M27, of the leg 5 (Vu =Vpp−$2V_{Tn-ch} - V_{Tp-ch}$); or the value of Vdd minus the threshold voltage of a natural n-channel transistor, in this instance the transistor M23 in the leg 4 (Vu=Vdd−$V_{Tn-ch\ nat}$)

For this circuit to operate properly, the programming voltage Vpp should be at least approximately 6 V; this operation rating can be lowered by reducing the number of the transistors in the leg 5, from three to two or just one (omitting the transistor M25, or transistor M26, or both) . However, a voltage value Vu higher than about 2.5 V, or a value whereat the whole circuitry supplied with Vu is operative, should be ensured.

The output signal VCCLOW from the comparator would be null under normal operating conditions, and be raised to the same voltage value Vu as is present on the line 2, either upon the supply voltage Vdd dropping below the tripping level, or under deep Power Down (PWD) conditions. In one aspect of the invention, threshold detector 1 is designed to have a tripping level of approximately 2.5 volts.

Actually, all the elements of the circuit are advantageously provided with MOS transistors (M9, M10, M12, M20 and M22) controlled by a signal PWDN, in negative logic, which is obtained from an external signal PWD through the inverter N4. This signal PWDN reduces the circuit consumption to zero by breaking all associated paths to ground and bringing the output VCCLOW to the value of Vu.

A conveniently delayed pulse PP is obtained from the trailing edge of the signal PWD through the monostable block 7. This signal is advantageously applied to the transistor M15 to quickly discharge the input I1 of the comparator at the outset of the normal operation period.

Likewise, the transistor M14, as activated by the signal TDISN, will disable the circuit operation while holding the comparator input I2 polarized to the value of VDD. The positive logic signal TDIS is also applied to the transistor M13 through the logic gate PL1 output.

A unique feature of the circuit under consideration is that it operates on a continuous range of supply voltages Vdd, and therefore, can vary the tripping threshold of the detector circuit, using a resistive divider and holding the voltage Vpp at values above 6 V.

Figure 3:
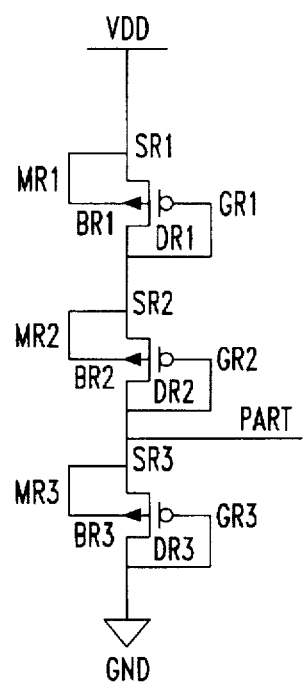
FIG. 3 shows a modified embodiment of a portion of the circuit in FIG. 2.

Depending on individual requirements, a MOS transistor divider in a diode configuration may be substituted for the resistance divider 9, as shown in FIG. 3. Of course, this solution would be applicable to those cases where the tripping threshold is higher than the combined diode chain thresholds.

Shown therein is a modified embodiment of the resistance divider 9 which provides for a series of three field-effect transistors, MR1, MR2 and MR3, to be connected between the supply voltage Vdd and ground.

These transistors are diode configured, that is have their gate GR1, GR2 and GR3 and drain DR1, DR2 and DR3 terminals connected together. In a similar manner, the source terminals SR1, SR2 and SR3 are connected together and to their respective body terminals BR1, BR2 and BR3.

The voltage signal PART is picked up from the source terminal SR3 of the third transistor MR3.

This modified circuit has an advantage in that it has lower space requirements, an important factor especially in view of its integration into a semiconductor. A statistical analysis carried out by the Applicant has proved the high accuracy of this circuit, which allows the tripping threshold to be accurately set through a wide range of temperatures (−40° C. to +150° C.), and this in the presence of varying process parameters; for a programming voltage Vpp =12 V, in fact, a set of values of the tripping threshold could be obtained which spread only marginally around the mean value.

The tripping voltage value can be changed by varying the values of the resistances R0 and R1 of the resistive divider 9 and, hence, the partition ratio.

The most important function of this circuit becomes manifest when the voltage Vpp has the programming value (e.g., about 12 V), or any high value, while the supply voltage Vdd is decreasing. In that case, the circuit continues to be supplied a stable voltage which ensures its proper operation, and the output can be utilized to reset all those external circuits which are precariously connected to the high voltage.

This is necessary for instance, when the threshold comparator is used within a memory circuit wherein the lack of control of the circuits connected to the high voltage (usually, the programming voltage) might result in some storage cells being erased or erroneously programmed.

The circuit of this invention is, therefore, innovative both in terms of stability of the tripping threshold of the output signal VCCLOW and of operation rangeability. In fact, it will retain its performance for all the values of the supply Vdd, and suit circuits being supplied higher voltages than 2 V (e.g., Vdd=3 V or Vdd =5 V).

It will be appreciated that, although a specific embodiment of the invention has been described herein for purposes of illustration, various modifications may be made without departing from the spirit and scope of the invention. Accordingly, the invention is not limited except as by the appended claims.

For example, instead of generating voltages, divider 9 and generator 8 could generate currents, and comparator 3 could be configured to receive currents at inputs I1 and I2. Furthermore, various ones of the MOS transistors could be substituted with bipolar transistors.

We claim:

1. A circuit for detecting a threshold voltage in storage devices integrated to a semiconductor and for which a power supply above a certain value is provided, comprising:

a comparator connected between a voltage supply line and a signal ground, and having a first or reference input and a second or signal input, as well as an output terminal;

a generator of a stable voltage reference having an output connected to said first input and a supply voltage divider connected to the second input of the comparator and means to feed said voltage supply line with the higher of the supply voltage value and the value of a programming voltage to the storage device.

2. A circuit as in claim 1 wherein said generator comprises a pair of natural MOS transistors, one of the p-channel type and the other of the n-channel type, and said reference voltage is obtained as the difference between the respective threshold voltages of said transistors.

3. A circuit as in claim 2 wherein said generator is connected between said voltage supply line and the signal ground, and the first of said transistors is connected between a resistive bias element and ground, whereas the second of said transistors is connected between said bias element and said first input of the comparator.

4. A circuit as in claim 1 wherein said voltage supply line is connected to the programming voltage pole through a series of transistors.

5. A circuit as in claim 1 wherein said voltage supply line is connected to the supply voltage pole through at least one transistor.

6. A circuit as in claim 2 wherein said divider comprises a series of MOS transistors in a diode configuration.

7. A circuit as in claim 1 wherein said first and second inputs are connected to the signal ground by connecting paths enabled by a power-down signal.

8. A circuit as in claim 1 wherein the comparator output is connected to a series of delay blocks.

9. A circuit as in claim 1 wherein a decoupler linked operatively to a power-down signal is connected between said divider and the second input of the comparator.

* * * * *